United States Patent
Hsieh et al.

[11] Patent Number: 6,017,795
[45] Date of Patent: Jan. 25, 2000

[54] METHOD OF FABRICATING BURIED SOURCE TO SHRINK CELL DIMENSION AND INCREASE COUPLING RATIO IN SPLIT-GATE FLASH

[75] Inventors: Chia-Ta Hsieh, Tainan; Jenn Tsao, Taipei; Di-Son Kuo, Hsinchu; Yai-Fen Lin, Taichung; Hung-Cheng Sung, Hsin-chu, all of Taiwan

[73] Assignee: Taiwan Semiconductor Manufacturing Company, Hsin-Chu, Taiwan

[21] Appl. No.: 09/072,996

[22] Filed: May 6, 1998

[51] Int. Cl.[7] .................................. H01L 21/8247
[52] U.S. Cl. .................... 438/262; 438/265; 438/266
[58] Field of Search .................... 438/262, 263, 438/264, 265, 266, 267

[56] References Cited

U.S. PATENT DOCUMENTS

| | | | |
|---|---|---|---|
| 5,313,421 | 5/1994 | Guterman et al. | 365/185 |
| 5,385,856 | 1/1995 | Hong | 437/43 |
| 5,395,779 | 3/1995 | Hong | 438/266 |
| 5,527,727 | 6/1996 | Kim | 437/43 |
| 5,627,393 | 5/1997 | Hsu | 257/331 |
| 5,915,178 | 6/1999 | Chiang et al. | 438/266 |

*Primary Examiner*—Chandra Chaudhari
*Attorney, Agent, or Firm*—George O. Saile; Stephen B. Ackerman

[57] ABSTRACT

A method is provided for forming a split-gate flash memory cell having reduced size, partially buried source line, increased source coupling ratio, improved programmability, and overall enhanced performance. A split-gate cell is also provided with reduced size and improved performance. The source line is formed in a trench in the substrate over the source region. The trench walls provide increased source coupling and the absence of gate bird's beak with the trench together shrink the cell size. Programmability is also enhanced through more favorable hot electron injection though intergate oxide between the floating gate and the control gate.

29 Claims, 5 Drawing Sheets

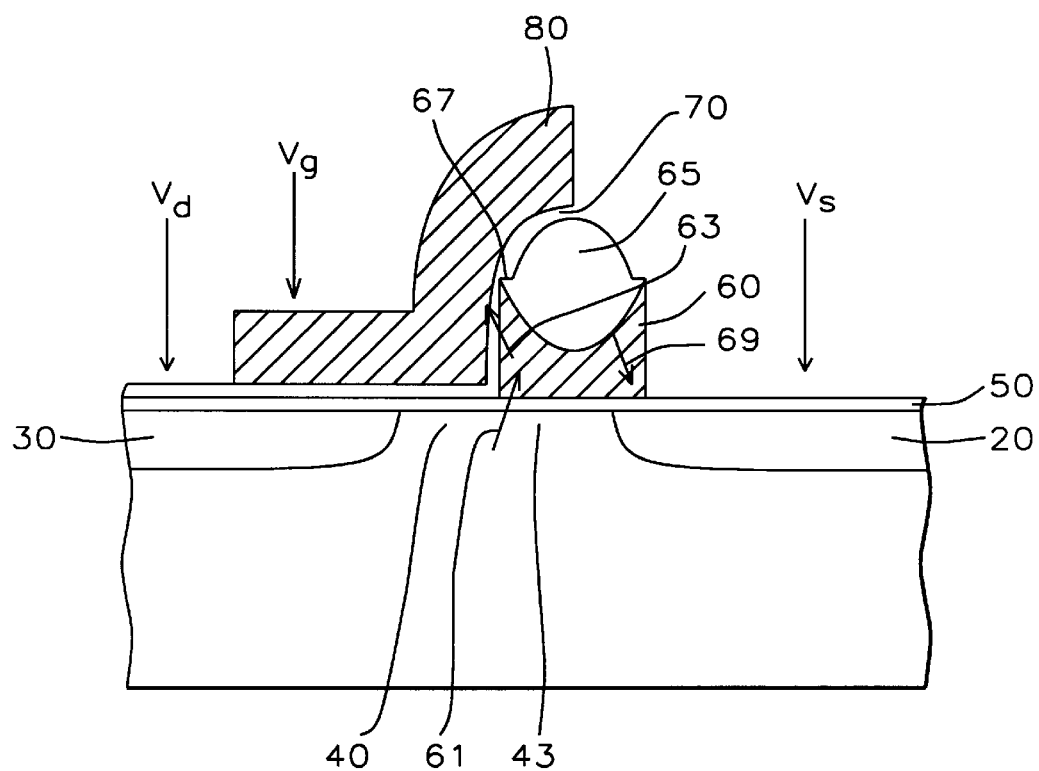
FIG. 1 – Prior Art

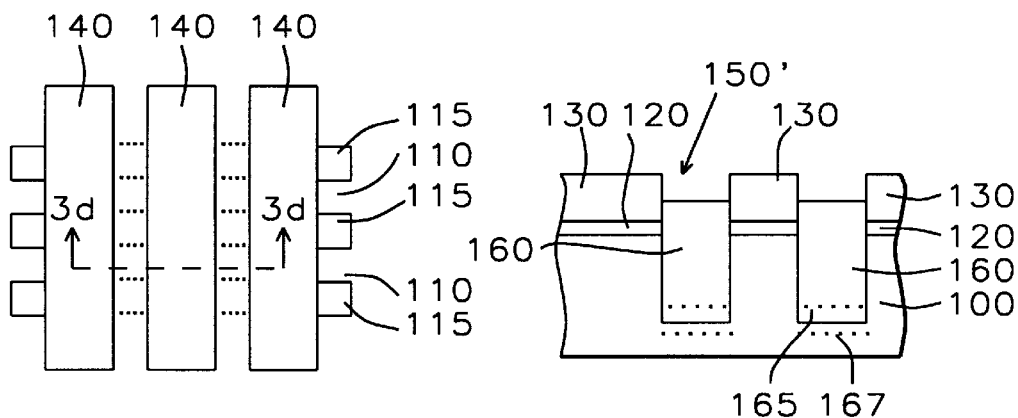
FIG. 2d
FIG. 3d
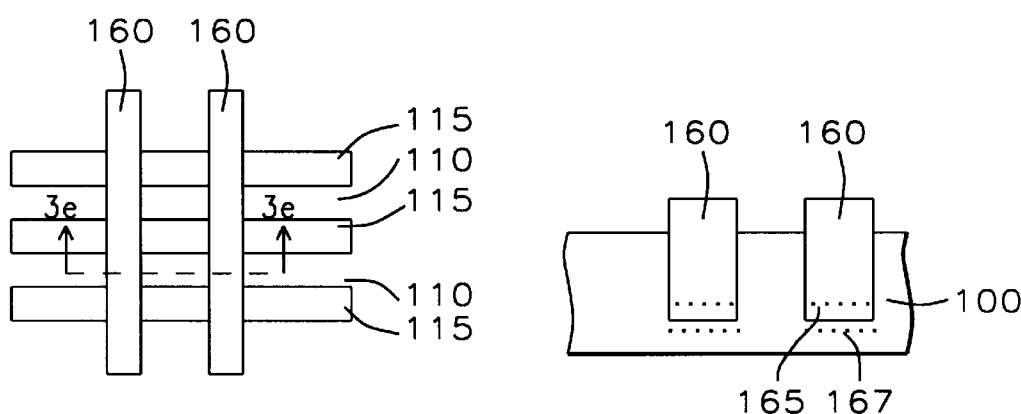
FIG. 2e
FIG. 3e
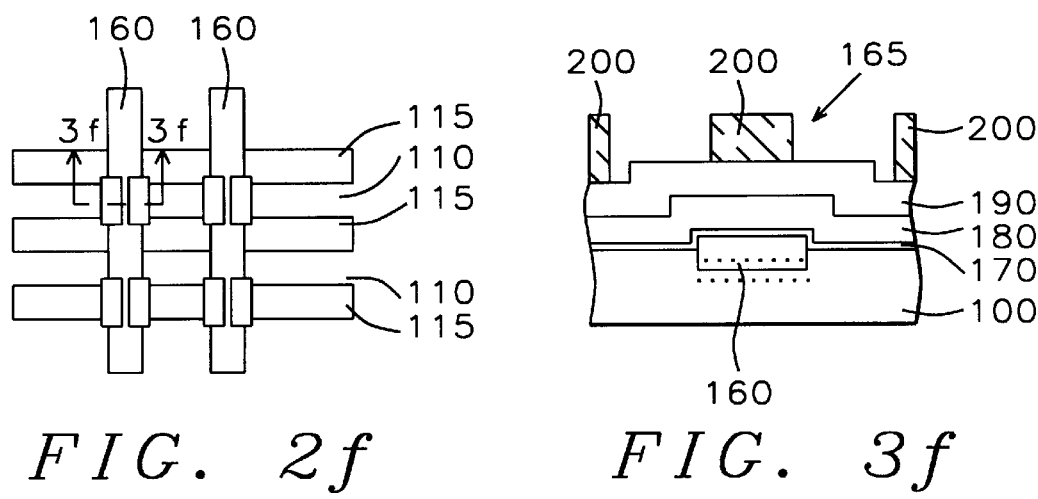
FIG. 2f
FIG. 3f

METHOD OF FABRICATING BURIED SOURCE TO SHRINK CELL DIMENSION AND INCREASE COUPLING RATIO IN SPLIT-GATE FLASH

BACKGROUND OF THE INVENTION (1) Field of the Invention

The present invention relates to semiconductor devices and more particularly to a method of forming a partially buried source in a split-gate flash memory cell in order to reduce the size of the cell and at the same time increase the coupling ratio for improved program speed.

(2) Description of the Related Art

Since the advent of the one-transistor memory cell, which contains one transistor and one capacitor, many variations of this simple cell have been advanced for the purposes of shrinking the size of the cell and, at the same time, improve its performance. The variations consist of different methods of forming capacitors, with single, double or triple layers of polysilicon, and different materials for the word and bit lines.

Memory devices include electrically erasable and electrically programmable read-only memories (EEPROMs) of flash electrically erasable and electrically programmable read-only memories (flash EEPROMS). Many types of memory cells for EEPROMs or flash EEPROMs may have source and drains regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell. If the source and drain regions are aligned to a spacer formed after the floating gate is formed, the floating gate typically does not overlie portions of the source and drain regions. Programming and erasing performance is degraded by the offset between the floating gate and source and drain regions.

Most conventional flash-EEPROM cells use a double-polysilicon (poly) structure of which the well known split-gate cell is shown in FIG. 1. Here, a MOS transistor is formed on a semiconductor substrate (10) having a first doped region (20), a second doped region (30), a channel region (40), a gate oxide (50), a floating gate (60), intergate dielectric layer (70) and control gate (80). Substrate (10) and channel region (40) have a first conductivity type, and the first (20) and second (30) doped regions have a second conductivity type that is opposite the first conductivity type.

As seen in FIG. 1, the first doped region, (20), lies within the substrate. The second doped region, (30), lies within substrate (10) and is spaced apart form the first doped region (20). Channel region (40) lies within substrate (10) and between first (20) and second (30) doped regions. Gate oxide layer (50) overlies substrate (10). Floating gate (60), to which there is no direct electrical connection, and which overlies substrate (10), is separated from substrate (10) by a thin layer of gate oxide (50) while control gate (80), to which there is direct electrical connection, is generally positioned over the floating gate with intergate oxide (70) therebetween.

In the structure shown in FIG. 1, control gate (80) overlaps the channel region, (43), adjacent to channel (40) under the floating gate, (60). This structure is needed because when the cell is erased, it leaves a positive charge on the floating gate. As a result, the channel under the floating gate becomes inverted. The series MOS transistor (formed by the control gate over the channel region) is needed in order to prevent current flow from control gate to floating gate. The length of the transistor, that is the overlap of the control gate over the channel region (43) determines the cell performance. Furthermore, edges (61), (63) can affect the programming of the cell by the source size and hot electron injection through the intergate dielectric layer (70) at such edges. Hot electron injection is further affected by, what is called, gate bird's beak (67) that is formed in conventional cells. On the other hand, it will be known to those skilled in the art that corners such as (69) can affect the source coupling ratio also. Any such adverse effects attributable source size can be alleviated as disclosed later in the embodiments of this invention.

To program the transistor shown in FIG. 1, charge is transferred from substrate (10) through gate oxide (50) and is stored on floating gate (60) of the transistor. The amount of charge is set to one of two levels to indicate whether the cell has been programmed "on" of "off." "Reading" of the cell's state is accomplished by applying appropriate voltages to the cell source (20) and drain (30), and to control gate (80), and then sensing the amount of charge on floating gate (60). To erase the contents of the cell, the programming process is reversed, namely, charges are removed from the floating gate by transferring them back to the substrate through the gate oxide.

This programming and erasing of an EEPROM is accomplished electrically and in-circuit by using Fowler-Nordheim tunneling as is well known in prior art. Basically, a sufficiently high voltage is applied to the control gate and drain while the source is grounded to create a flow of electrons in the channel region in the substrate. Some of these electrons gain enough energy to transfer from the substrate to the floating gate through the thin gate oxide layer by means of Fowler-Nordheim tunneling. The tunneling is achieved by raising the voltage level on the control gate to a sufficiently high value of about 12 volts. As the electronic charge builds up on the floating gate, the electric field is reduced, which reduces the electron flow. When, finally, the high voltage is removed, the floating gate remains charged to a value larger than the threshold voltage of a logic high that would turn it on. Thus, even when a logic high is applied to the control gate, the EEPROM remains off. Since tunneling process is reversible, the floating gate can be erased by grounding the control gate and raising the drain voltage, thereby causing the stored charge on the floating gate to flow back to the substrate. Of importance in the tunneling region is the quality and the thinness of the tunneling oxide separating the floating gate from the substrate. Usually a thickness of between about 80 to 120 Angstroms is required to facilitate Fowler-Nordheim tunneling.

In the conventional memory cell shown in FIG. 1, word lines (not shown) are connected to control gate (80) of the MOS transistor, while the length of the MOS transistor itself is defined by the source (20) drain (30) N+ regions shown in the same Figure. As is well known by those skilled in the art, the transistor channel is defined by masking the N+ regions. However, the channel length of the transistor varies depending upon the alignment of the floating gate (60) with the source and drain regions. This introduces significant variations in cell performance from die to die and from wafer to wafer. Furthermore, the uncertainty in the final position of the N+ regions causes variations in the series resistance of the bit lines connected to those regions, and hence additional variation in the cell performance. Finally, in order to insure that the resistance of the bit line is acceptably low, the bit lines over the N+ regions are formed wider than the required minimum, thereby giving rise to an increase in the overall area of the cell. However, alternatively, the resistance of the bit line can be improved by judicious use of trenches without giving rise to an increase in the overall area of the cell as it is disclosed later in the embodiments of this invention.

In prior art, different methods are shown for fabricating different split-gate memory cells. A vertical channel device having buried source is described by Hsu in U.S. Pat. No. 5,627,393. In this approach, two levels of trenches are formed. The lower level trenches are etched through a well region into the buried source region and then filled with polysilicon to form gate electrodes. Drain regions are formed adjacent to the trenches by depositing, and etching back a second polysilicon layer and then ion implanting to form drain regions. Two sets of contact upper trenches are formed through silicon oxide layers subsequently deposited. The contact trenches are filled with tungsten to establish contact with drain and source regions.

Kim, in U.S. Pat. No. 5,527,727 discloses a method of manufacturing a split gate EEPROM cell where the electrical characteristics of the cell can be improved by decreasing the topology generated by the oxide film formed in a bit line containing a source region and a drain region. Hong, on the other hand, discloses a fieldless split-gate flash EPROM in U.S. Pat. No. 5,385,856. Guterman, et al., disclose still another EEPROM with split gate, in U.S. Pat. No. 5,313,421, utilizing source-side injection, allowing very small programming currents.

The present invention discloses a different method of fabricating a split-gate memory cell where the problems of programmability due to hot electron injection at edges of the cell and high resistance of lines as affected by the source size can be alleviated, and where the size of the cell can be reduced substantially.

SUMMARY OF THE INVENTION

It is therefore an object of this invention to provide a method of providing a split-gate flash memory with reduced cell size.

It is another object of this invention to provide a method of providing a split-gate flash memory having partially buried source.

It is still another object of this invention to provide a method of providing a split-gate flash memory having increased source coupling ratio and improved programmability.

It is an overall object of this invention to provide a split-gate flash memory cell having reduced size, partially buried source line, increased source coupling ratio and improved programmability.

These objects are accomplished by providing a silicon substrate having a plurality of active and field areas defined; forming a pad oxide layer over said substrate; depositing a first layer of nitride over said pad oxide layer; forming a first patterned photoresist mask over said layer of nitride, wherein said patterns correspond to source regions formed in said active areas of said silicon substrate; etching said first layer of nitride and said pad oxide through openings in said patterned photoresist mask; etching further to form a source line trench in said silicon substrate; removing said first photoresist mask; performing a partial selective epitaxial growth (SEG) in said trench; forming a source region in said SEG in said trench over said active regions; removing said first layer of nitride and pad oxide layer; forming a sacrificial oxide over said substrate; removing said sacrificial oxide; forming a layer of gate oxide over said substrate; depositing a first layer of polycrystalline silicon (polysilicon) over said substrate; depositing a second layer of nitride over said first layer of polycrystalline silicon; forming a second patterned photoresist mask over said second layer of nitride; etching said second layer of nitride and said gate oxide through openings in said second patterned photoresist mask; performing ion implantation through said openings in said second patterned photoresist mask; removing said second photoresist mask; performing thermal oxidation of said first layer of polysilicon to form polyoxide and define a floating gate of said memory cell; removing said second layer of nitride; etching said first layer of polysilicon using said polyoxide as a hard mask; forming interpoly oxide over said polyoxide; depositing a second layer of polysilicon over said interpoly oxide; and patterning said second layer of polysilicon to form a control gate to complete the forming of said memory cell.

These objects are further accomplished by providing memory cell with partially buried source and improved coupling ratio comprising: a substrate having active and field regions defined; a partially buried source line formed therein; a plurality of floating gates formed substantially sharing said source line; and a plurality of control gates over said plurality of said floating gates.

BRIEF DESCRIPTION OF THE DRAWINGS

FIG. 1 is a cross-sectional view of a semiconductor substrate showing a double-polysilicon structure of the well-known split-gate of prior art.

FIGS. 2a–2j and 3a–3j show schematically steps of forming buried source lines in a semiconductor substrate according to this invention. Specifically, FIGS. 2a–2j show the top view of a substrate at selected process steps, while FIGS. 3a–3j show the cross section of the same substrate at the same location corresponding to a given process step. Thus:

FIGS. 2a and 3a show the forming of a pad oxide and a layer of nitride on a semiconductor, according to this invention.

FIGS. 2b and 3b show the patterning of a photoresist layer and the subsequent etching of openings in the nitride and pad oxide layers of FIGS. 2a and 2b, according to this invention.

FIG. 2c and 3c show the etching of trenches in the substrate of FIGS. 2b and 3b through the openings in the nitride and pad oxide layers, and the siubsequent growing of surface oxide on the internal surfaces of the trench of this invention.

FIGS. 2d and 3d show selective removal of the surface oxide of FIGS. 2c and 2d at the bottom and upper sidewalls of the trench of this invention.

FIGS. 2e and 3e show the filling of the trench of FIGS. 2d and 3d by using selective epitaxial growth (SEG) process of to this invention.

FIGS. 2f and 3f show, after the removal of the pad oxide and nitride layers in FIGS. 2e and 3e, the completion of the forming of a buried source line integrated with the source regions in the substrate of this invention.

FIGS. 2g–h and FIGS. 3g–3h show the forming of the floating gate of the split-gate flash memory cell of this invention.

FIG. 2i and FIGS. 3i–3j show the forming of the control gate of the split-gate flash memory cell of this invention.

DESCRIPTION OF THE PREFERRED EMBODIMENTS

Figure 2A:
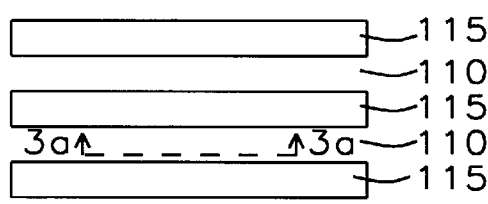

Referring now to the drawings, in particular to FIGS. 2a–2k, and 3a–3k, there are shown schematically steps of forming partially buried source line in a semiconductor substrate. FIGS. 3a–3k show the top view of substrate (100) at selected process steps, while FIGS. 3a–3i show the cross section of the same substrate at the same location corresponding to a given process step.

In FIG. 2a, substrate (100), preferably silicon, is provided with active device regions, and passive field regions already defined as is well known in the art. Active regions are denoted by reference numeral (110), and field regions by (115). Cross-section (3a—3a) is a cut across representative active region (110) in FIG. 2a, and is shown in FIG. 3a.

Figure 3A:
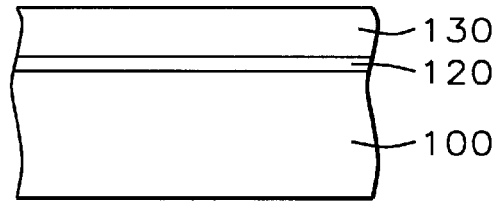

As shown in FIG. 3a, a pad oxide (120) is first formed on substrate (100). Pad oxide (120) can be formed by thermal oxidation process at a temperature between about 850° C. to 950° C. Alternatively, the pad oxide can be formed by an atmospheric or low pressure chemical vapor deposition (LPCVD) process as is well known. Pad oxide layer (120) has a thickness between about 400 to 500 angstroms (Å). A layer of silicon nitride (130) is next deposited over pad oxide layer (120) as shown in the same FIG. 3a. The silicon nitride layer is formed with low pressure chemical vapor deposition (LPCVD) at a chamber pressure between about 0.25 to 1.0 torr, temperature between about 650° C. to 750° C. by reacting dichlorosilane ($SiCl_2H_2$) with ammonia ($NH_3$) with flow rates between about 80 to 120 standard cubic centimeters per minute (sccm). The preferred thickness of nitride layer (130) is between about 750 to 850 angstroms (Å).

Figure 2B:
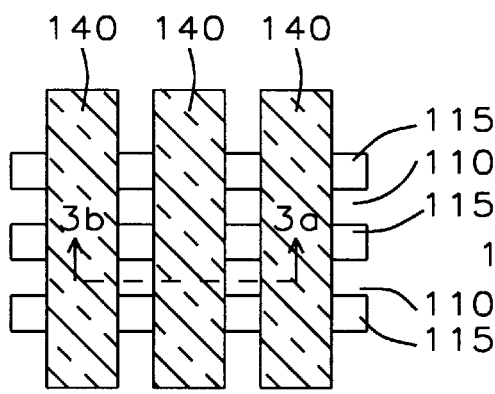
Figure 3B:
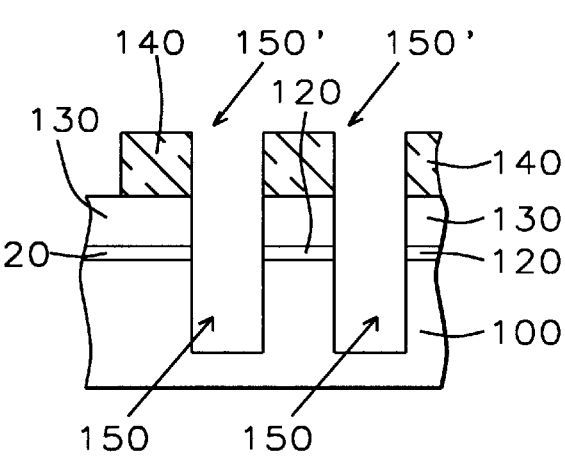
Figure 2C:
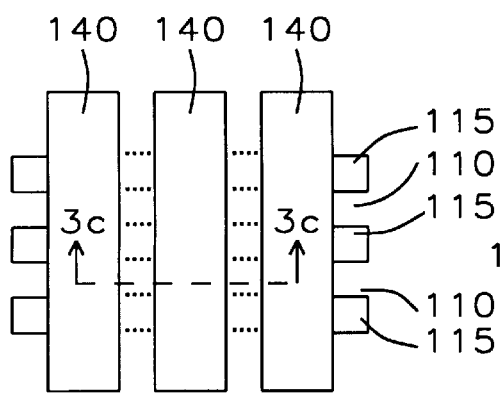
Figure 3C:
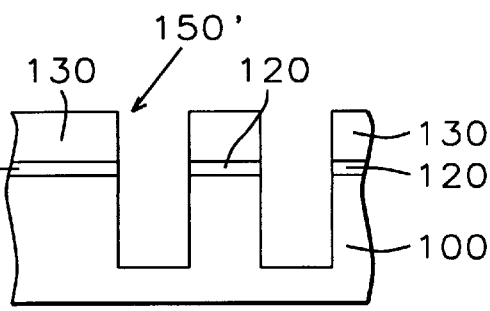
Figure 2G:
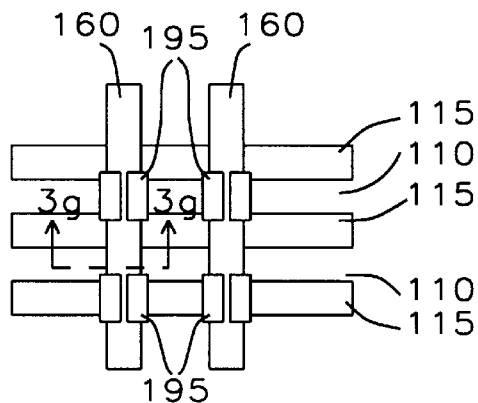
Figure 3G:
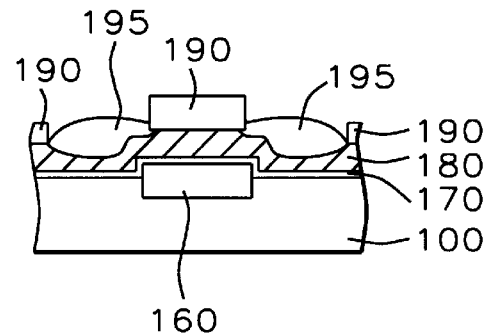
Figure 2H:
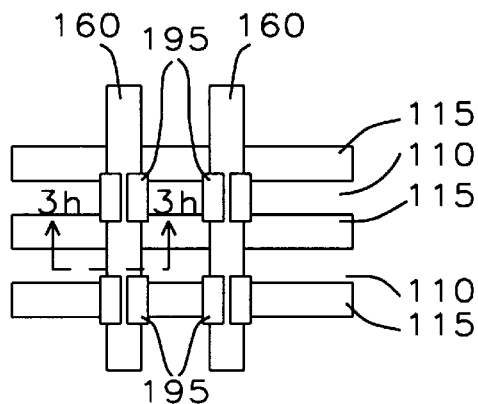

Following the forming of pad oxide, and nitride layers, a photoresist layer (140) is formed over nitride layer (130), as shown in FIG. 3b, having a line pattern corresponding to the source regions (not shown) that are formed in active regions (110) shown in FIG. 2b. Resist layer (140) should have a thickness between about 1.0 to 1.2 micrometers (am). The nitride and pad oxide layers, (130) and (120), respectively, are etched through the pattern openings (150') in resist (140) as shown in the cross-sectional view of FIG. 3b. The nitride etch can be accomplished with etch recipe comprising Ar, $CHF_3$, $C_4F_8$ at flow rates between about 60 to 160, 20 to 160 and 5 to 20 sccm, respectively, while pad oxide can be etched using $CHF_3$ and $O_2$ plasma with a power between about 1500 to 2000 watts.

Now, as a main feature and key spirit of the present invention, the openings (150') are then transferred into the substrate by etching silicon using a dry etch, such as a plasma etch using $O_2$ and $CF_4$ at flow rates between about 50 to 150 and 0 to 20 sccm, respectively with energy between about 40 to. The resulting trenches, (150), in the substrate as shown in FIG. 2b preferably have a depth between about 700 to 800. After the forming of trenches (150), photoresist layer (140) is removed.

A critical step then follows, namely, trench (150) is filled a material to serve as a buried source line. Selective epitaxial growth (SEG) is preferred in the presently disclosed embodiment because this also produces an isolation structure with no attendant encroachment or bird's beak problems, as will be recognized by those skilled in the art. This feature, in itself, reduces cell size due to the absence of bird's beak, or, alternatively, provides a larger source contact area at the same cell size. In addition, SEG fills the trench (150) to the desired level evenly, without the need for overfill and etchback, as would be required with polysilicon refill, for example. It is a key aspect of this invention that SEG partially fill trench hole (150). It is preferred that the depth of SEG in trench (150) is between about 500 to 600 Å. This is shown schematically in FIG. 3d where SEG (160) fills to approximately 75% of the depth trench (150).

SEG fill of trench (150) can be accomplished through hydrogen reduction of tetrachloride ($SiCl_4$), tricholorosilane ($SiHCl_3$), or dichlorosilane ($SiH_2Cl_2$). In this case, it is preferred that this chemical vapor deposition is performed with $SiHBR_3$ at a temperature between about 500 to 600° C.

Still using the nitride layer, (130), as a mask, N-type ions are implanted (not shown) vertically through openings (150'), thus forming a conductive buried line (165) and source (167) as shown in FIG. 3e. The ion implantation is accomplished preferably with arsenic ions at a dosage level between about $3.0 \times 10^{15}$ to $5.0 \times 10^{15}$ atoms/$cm^2$ and energy between about 60 to 90 KeV. Next, nitride layer and pad oxide are removed as shown in FIG. 3e, and hence the forming of the partially buried source line (160) as integrated with the underlying source region is completed. The recipe used in removing layers (120) and (130) comprises gases Ar, $CHF_3$, $C_4F_8$ at flow rates between about 60 to 120, 20 to 140 and 0 to 20 sccm, respectively.

The next step is employed to remove any silicon damage that may have occurred during the previous implantation step. This is accomplished by thermally growing an oxide layer, or sacrificial layer (not shown) and then removing it. The sacrificial oxide is formed at a temperature between about 800 to 900° C., and then removed with a recipe comprising gases Ar, $CHF_3$, $C_4F_8$ at flow rates between about 60 to 120, 20 to 140 and 0 to 20 sccm, respectively.

Still another oxide layer, this time a gate oxide layer (170), shown in FIG. 3f, is grown on the substrate at a temperature between about 850 to 950° C. and with a thickness between about 500 to 600 Å. This is followed by the forming of a first layer of polysilicon (180) through reduction of $SiH_4$ using LPCVD at a temperature between about 600 to 650° C. The preferred thickness of the first layer of polysilicon is between about 2400 to 2800 Å. A second layer of nitride (190) is next formed by reacting dichlorosilane ($SiCl_2H_2$) with ammonia ($NH_3$) in an LPCVD at a pressure between about 0.25 to 1.0 torr, temperature between about 650 to 750° C. and at flow rates between about 80 to 120 sccm. The preferred thickness of the second layer of polysilicon is between about 750 to 850 Å.

Figure 3H:
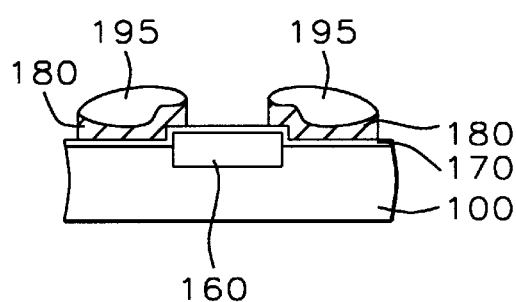
Figure 2I:
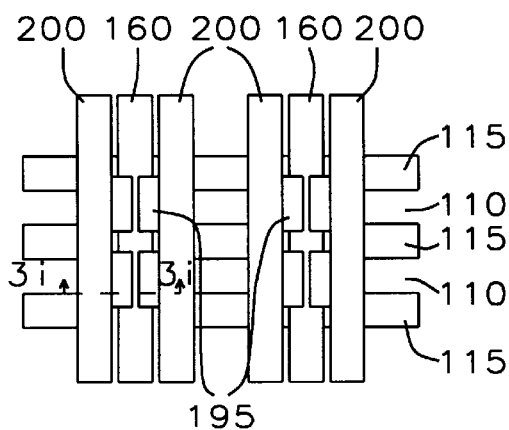

A second photoresist mask (200) is next formed over the second layer of nitride with patterns corresponding to areas where floating gates are to be defined. The nitride and gate oxide layers underlying the second photoresist mask are etched using a recipe comprising gases Ar, $CHF_3$, $C_4F_8$ at flow rates between about 60 to 120, 20 to 140 and 0 to 20 sccm, respectively. Using the same pattern openings in the photoresist mask, and now in the nitride and oxide layers, cell implantation is performed with phosphorous ions at a dosage level between about $5 \times 10^{16}$ to $5 \times 10^{16}$ atoms/$cm^2$ and energy between about 40 to 60 KeV. The photoresist mask is then removed and the first layer of polysilicon is next wet oxidized at a temperature between about 860 to 910° C. to form polyoxide (195), which in turn will be used as a hard mask to etch and remove the remaining first layer polysilicon on the substrate. Prior to etching the polysilicon layer, second nitride layer (190) is removed by using etch recipe Ar, $CHF_3$, $C_4F_8$ at flow rates between about 60 to 120, 20 to 140 and 0 to 20 sccm, respectively. The etch recipe for removing the polysilicon layer comprises gases Hbr, $Cl_2$, He and $O_2$. The resulting structure comprising polyoxide layer (195) and the underlying poly-floating gate (180) adjacent to partially buried source line (160) with intervening gate oxide layer (170) is shown in FIG. 3h.

Figure 3I:
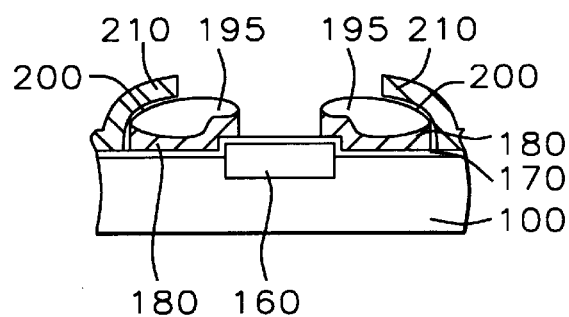

The penultimate step of completing the forming of the split-gate memory cell structure is accomplished first by depositing an interpoly oxide (200) as shown in FIG. 3i. It is preferred that layer (200) is oxynitride, which is well known in the art, and that it has a thickness between about 350 to 400 Å. At the final step, a second layer of polysilicon is deposited over interpoly oxide (200) and is patterned to form the control gate, (210), as shown in the same FIG. 3I. It is preferred that the second layer of polysilicon is formed using silicon source $SiH_4$ in an LPCVD chamber at a temperature between about 600 to 650° C., and that it has a thickness between about 2600 to 3000 Å.

Figure 3J:
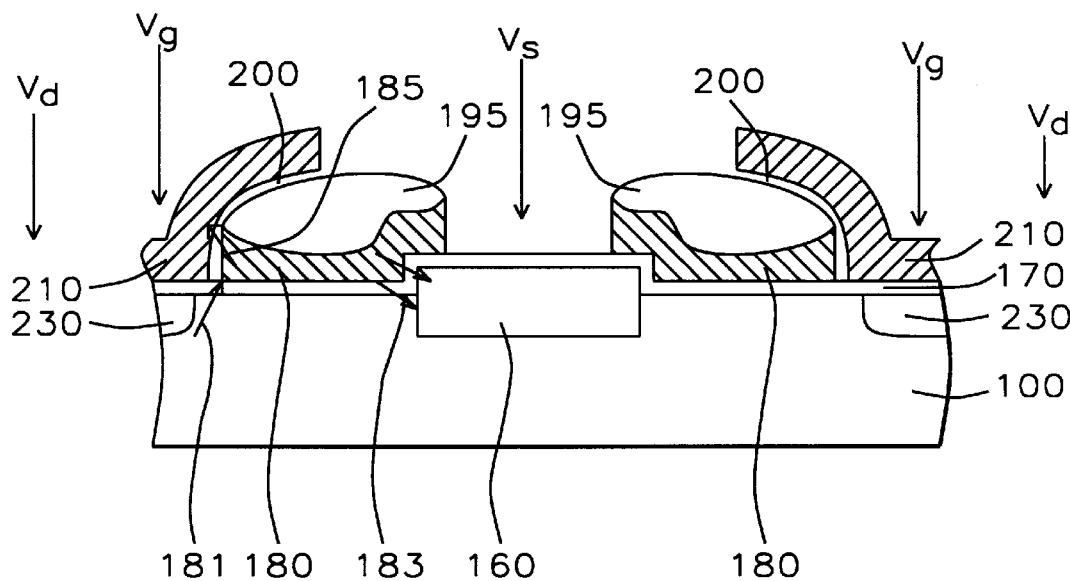
Figure 3K:
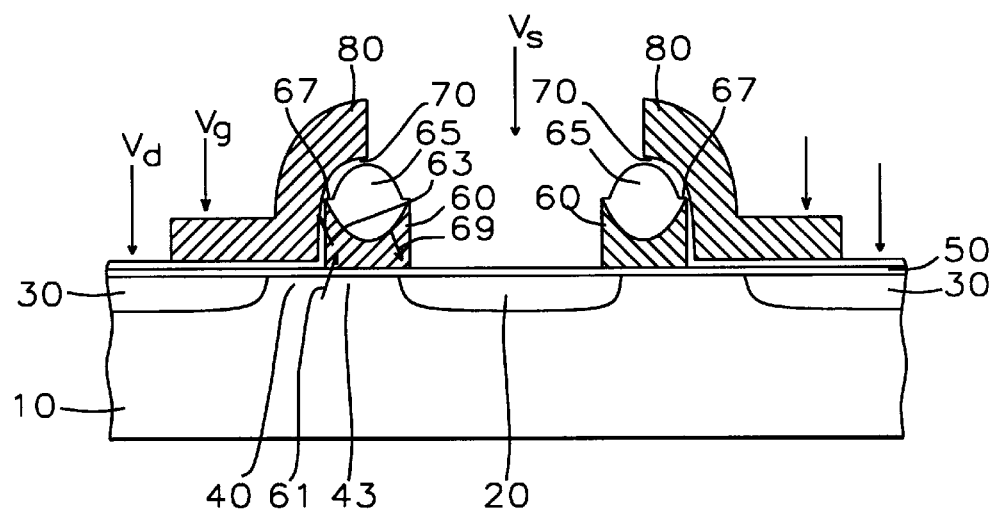
FIG. 3k is the same view of FIG. 1 of prior art.

In comparing the split-gate flash memory of this invention shown in FIG. 3j with that of prior art shown in FIG. 3k, it will be appreciated by those skilled in the art that the partially buried source line, (160), of this invention as integrated with its source (220) shrinks the over-all cell area. Furthermore, the absence of any gate bird's beak (67) found in conventional structures near edge (185) also helps reduce the cell area. Secondly, programmability is also enhanced through more favorable hot electron injection though uninterrupted intergate oxide between the floating gate and the control gate. Finally, the capacitive coupling between the partially buried source line and the floating gate (195) of this invention is increased substantially because of the additional area (183) that is available on the side walls of the buried line (160) as seen in FIG. With these added improvements, the performance and speed of the presently disclosed split-gate memory cell is enhanced substantially.

Though these numerous details of the disclosed method are set forth here, such as process parameters, to provide an understanding of the present invention, it will be obvious, however, to those skilled in the art that these specific details need not be employed to practice the present invention. At the same time, it will be evident that the same methods may be employed in other similar process steps that are too many to cite, such as, for example, for fabricating buried lines over drain and other regions in the substrate, as well.

That is to say, while the invention has been particularly shown and described with reference to the preferred embodiments thereof, it will be understood by those skilled in the art that various changes in form and details may be made without departing from the spirit and scope of the invention.

What is claimed is:

1. A method of forming buried source in a memory cell to increase the coupling ratio for improved program speed comprising the steps of:

providing a silicon substrate having a plurality of active and field areas defined;

forming a pad oxide layer over said substrate;

depositing a first layer of nitride over said pad oxide layer;

forming a first patterned photoresist mask over said layer of nitride, wherein said patterns correspond to source regions formed in said active areas of said silicon substrate;

etching said first layer of nitride and said pad oxide through openings in said patterned photoresist mask;

etching further to form a source line trench in said silicon substrate;

removing said firs t photoresist mask;

performing a partial selective epitaxial growth (SEG) in said trench;

forming a source region in said SEG in said trench over said active regions;

removing said first layer of nitride and pad oxide layer;

forming a sacrificial oxide over said substrate;

removing said sacrificial oxide;

forming a layer of gate oxide over said substrate;

depositing a first layer of polycrystalline silicon (polysilicon) over said substrate;

depositing a second layer of nitride over said first layer of polycrystalline silicon;

forming a second patterned photoresist mask over said second layer of nitride;

etching said second layer of nitride and said gate oxide through openings in said second patterned photoresist mask;

performing ion implantation through said openings in said second patterned photoresist mask;

removing said second photoresist mask;

performing thermal oxidation of said first layer of polysilicon to form polyoxide and define a floating gate of said memory cell;

removing said second layer of nitride;

etching said first layer of polysilicon using said polyoxide as a hard mask;

forming interpoly oxide over said polyoxide;

depositing a second layer of polysilicon over said interpoly oxide; and patterning said second layer of polysilicon to form a control gate to complete the forming of said memory cell.

2. The method of claim 1, wherein said forming a pad oxide layer is accomplished by thermal growth at a temperature between about 850 to 950° C.

3. The method of claim 2, wherein said pad oxide layer has a thickness between about 400 to 500 angstroms (Å).

4. The method of claim 1, wherein said depositing a first layer of nitride is accomplished with LPCVD at a chamber pressure between about 0.25 to 1.0 torr, temperature between about 650° C. to 750° C. by reacting dichlorosilane ($SiCl_2H_2$) with ammonia ($NH_3$) at flow rates between about 80 to 120 standard cubic centimeters per minute (sccm).

5. The method of claim 4, wherein the thickness of said layer of nitride is between about 750 to 850 Å.

6. The method of claim 1, wherein said photoresist mask has a thickness between about 1 to 1.2 micrometers ($\mu$m).

7. The method of claim 1, wherein said etching said first layer of nitride and pad oxide is accomplished with etch recipe comprising Ar, $CHF_3$, $C_4F_8$ at flow rates between about 60 to 120, 20 to 140 and 0 to 20 sccm, respectively.

8. The method of claim 1, wherein said etching further to form a source trench in said silicon substrates is accomplished with etch recipe comprising $O_2$ and $CF_4$ at flow rates between about 50 to 150 and 0 to 20 sccm, respectively.

9. The method of claim 8, wherein said source trench has a depth between about 700 to 800 angstroms (Å).

10. The method of claim 1, wherein said performing partial selective epitaxial growth (SEG) in said trench is accomplished by chemical vapor deposition of $SiHBr_3$ at a temperature between about 500 to 600° C.

11. The method of claim 1, wherein said forming a source region is accomplished by implanting arsenic ions with a dosage between about $3.0 \times 10^{15}$ to $5.0 \times 10^{15}$ atom/$cm^2$ and at an energy between about 60 to 90 KeV.

12. The method of claim 1, wherein said removing said first layer of nitride and pad oxide layer is accomplished with a recipe comprising Ar, $CHF_3$, $C_4F_8$ at flow rates between about 60 to 120, 20 to 140 and 0 to 20 sccm, respectively.

13. The method of claim 1, wherein said forming a sacrificial oxide is accomplished by thermal growth at a temperature between about 800 to 900° C.

14. The method of claim 1, wherein said removing of said sacrificial oxide is accomplished with a recipe comprising Ar, $CHF_3$, $C_4F_8$ at flow rates between about 60 to 120, 20 to 140 and 0 to 20 sccm, respectively.

15. The method of claim 1, wherein said forming a layer of gate oxide is accomplished by thermal growth at a temperature between about 850 to 950° C.

16. The method of claim 15, wherein said layer of gate oxide has a thickness between about 500 to 600 angstroms (Å).

17. The method of claim 1, wherein said depositing a first layer of polysilicon is accomplished with silicon source $SiH_4$ using LPCVD at a temperature between about 600 to 650° C.

18. The method of claim 1, wherein said first layer of polysilicon has a thickness between about 2400 to 2800 angstroms (Å).

19. The method of claim 1, wherein said depositing a second layer of nitride is accomplished with LPCVD at a chamber pressure between about 0.25 to 1.0 torr, temperature between about 650° C. to 750° C. by reacting dichlorosilane ($SiCl_2H_2$) with ammonia ($NH_3$) at flow rates between about 80 to 120 standard cubic centimeters per minute (sccm).

20. The method of claim 19, wherein the thickness of said second layer of nitride is between about 750 to 850 Å.

21. The method of claim 1, wherein said second photoresist mask has a thickness between about 1 to 1.2 micrometers ($\mu$m).

22. The method of claim 1, wherein said etching said second layer of nitride and gate oxide through openings in said second photoresist mask is accomplished with etch recipe comprising Ar, $CHF_3$, $C_4F_8$ at flow rates between about 60 to 120, 20 to 140 and 0 to 20 sccm, respectively.

23. The method of claim 1, wherein performing ion implantation through said openings in said second patterned photoresist mask is accomplished using phosphorus at a dosage level between about $5\times10^6$ to $7\times10^6$ atoms/cm$^2$ with energy level between about 40 to 60 KeV.

24. The method of claim 1, wherein said performing thermal oxidation of said first layer of polysilicon to form polyoxide is accomplished by wet oxidation at a temperature between about 860 to 910° C.

25. The method of claim 1, wherein said removing said second layer of nitride is accomplished with a recipe comprising Ar, $CHF_3$, $C_4F_8$ at flow rates between about 60 to 120, 20 to 140 and 0 to 20 sccm, respectively.

26. The method of claim 1, wherein said etching said first layer of polysilicon using said polyoxide as a hard mask is accomplished with a recipe comprising gases HBr, $CL_2$, He and $O_2$.

27. The method of claim 1, wherein said interpoly oxide is oxynitride with a thickness between about 350 to 400 Å.

28. The method of claim 1, wherein said depositing a second layer of polysilicon over said interpoly oxide is accomplished with silicon source $SiH_4$ using LPCVD at a temperature between about 600 to 650° C.

29. The method of claim 28, wherein said second layer of polysilicon to form a control gate has a thickness between about 2600 to 3000 Å.

* * * * *